United States Patent
Hawker et al.

(10) Patent No.: US 6,342,454 B1
(45) Date of Patent: Jan. 29, 2002

(54) ELECTRONIC DEVICES WITH DIELECTRIC COMPOSITIONS AND METHOD FOR THEIR MANUFACTURE

(75) Inventors: Craig Jon Hawker, Los Gatos; James L. Hedrick, Pleasanton; Robert D. Miller; Willi Volksen, both of San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/441,730

(22) Filed: Nov. 16, 1999

(51) Int. Cl.[7] .................. H01L 21/31; H01L 21/469; H01L 21/4763

(52) U.S. Cl. .................. 438/780; 438/781; 438/790; 438/623; 438/624; 438/633; 521/184; 521/185; 521/183

(58) Field of Search .................. 438/780, 781, 438/790, 623, 624, 633; 521/82, 184, 183, 185, 189

(56) References Cited

U.S. PATENT DOCUMENTS

| | | | |
|---|---|---|---|
| 4,855,331 A | * | 8/1989 | Lanier et al. ............ 521/184 |
| 5,158,986 A | * | 10/1992 | Cha et al. ............ 521/82 |
| 5,308,749 A | | 5/1994 | Sutton et al. |
| 5,716,665 A | * | 2/1998 | Vita et al. ............ 427/119 |
| 5,767,014 A | | 6/1998 | Hawker et al. |
| 5,776,990 A | | 7/1998 | Hedrick et al. |
| 5,858,871 A | | 1/1999 | Jeng |
| 5,883,219 A | | 3/1999 | Carter et al. |
| 6,031,058 A | * | 2/2000 | McIntosh et al. ............ 526/171 |
| 6,077,792 A | * | 6/2000 | Farrar ............ 438/780 |
| 6,239,019 B1 | * | 5/2001 | Chiang et al. ............ 438/624 |

OTHER PUBLICATIONS

Hedrick et al. (1993), "High Temperature Polymer Foams," *Polymer* 34(22):4717–4726.

Hedrick et al. (1995), Polyimide Foams Derived From Poly(4,4'–Oxydiphenylpyromellitimide) and Poly($\alpha$–Methylstyrene), *High Perform. Polym.* 7: 133–147.

Hedrick et al. (1995), "High Temperature Nanofoams Derived From Rigid and Semi–Rigid Polyimides," *Polymer* 36(14):2685–2697.

Hedrick et al. (1995), "The Use of Styrenic Copolymers to Generate Polyimide Nanofoams," *Polymer* 36(25):4855–4866.

Hedrick et al. (1995), "Polyimide Nanofoams Prepared From Styrenic Block Copolymers," *Microelectronics Technology, Polymers for Advanced Imaging and Packaging,* ACS Symposium Series, ACS, Washington D.C., 614:425–438.

Hedrick et al. (1996), "High $T_g$ Polyimide Nanofoams Derived From Pyromellitic Dianhydride and 1,1–Bis(4–Aminophenyl)–1–Phenyl–2,2,2–Trifluoroethane," *Journal of Polymer Science: Part A: Polymer Chemistry* 34:2867–2877.

(List continued on next page.)

Primary Examiner—Matthew Smith
Assistant Examiner—V. Yevsikov
(74) Attorney, Agent, or Firm—Reed & Associates

(57) ABSTRACT

A novel dielectric composition is provided that is useful in the manufacture of electronic devices such as integrated circuit devices and integrated circuit packaging devices. The dielectric composition is prepared by crosslinking a thermally decomposable porogen to a host polymer via a coupling agent, followed by heating to a temperature suitable to decompose the porogen. The porous materials that result have dielectric constants less than about 3.0, with some materials having dielectric constants less than about 2.5. Integrated circuit devices, integrated circuit packaging devices, and methods of manufacture are provided as well.

34 Claims, 2 Drawing Sheets

OTHER PUBLICATIONS

Hedrick et al. (1996), "Polyimide Foams Derived From a High $T_g$ Polyimide With Grafted Poly(α–methylstyrene)," *Polymer* 37(23):5229–5236.

Hedrick et al. (1996), "High–Temperature Polyimide Nanofoams for Microelectronic Applications," *Reactive & Functional Polymers* 30:43–53.

Hedrick et al. (1998), "Templating Nanoporosity in Thin-Film Dielectric Insulators," *Advanced Materials* 10(13):1049–1053.

Hedrick et al. (1998), "Templating Nanoporosity in Organosilicates Using Well–Defined Branched Macromolecules," *Organic/Inorganic Hybrid Materials,* Materials Research Society Symposium Proceedings 519:65–75.

St. Clair et al. (1988), "Low Dielectric Polyimides for Electronic Applications," *Polymeric Materials Science and Engineering,* Proceedings of the ASC Division of Polymeric Materials: Science and Engineering 59:28–32.

* cited by examiner

ELECTRONIC DEVICES WITH DIELECTRIC COMPOSITIONS AND METHOD FOR THEIR MANUFACTURE

RELATED APPLICATION

This application is based on a common specification with concurrently filed application Ser. No. 09/441,728 issued Aug. 22, 2000, now U.S. Pat. No. 6,107,357, titled "DIELECTRIC COMPOSITIONS AND METHOD FOR THEIR MANUFACTURE".

TECHNICAL FIELD

This invention relates generally to dielectric materials and their use in electronic devices such as integrated circuits. More particularly, the invention pertains to novel dielectric materials of foamed polymers and associated methods of preparation. The novel dielectric materials are particularly useful in the fabrication of electronic devices such as integrated circuit devices and integrated circuit packaging devices.

BACKGROUND

As semiconductor devices are becoming smaller and on-chip device density is correspondingly increasing, both signal delays due to capacitive coupling and crosstalk between closely spaced metal lines are increasing. These problems are exacerbated by the need to keep conductor lines as short as possible in order to minimize transmission delays, thus requiring multilevel wiring schemes for the chip. The problems have been ameliorated to some extent by the switch to copper metallurgy, but as feature sizes go below 0.25 $\mu$m, this alone will not provide a solution. The use of an insulator with a lower dielectric constant than the currently used $SiO_2$ (k=8.9–4.1) would also, clearly, improve the situation. Current integration demands for insulators used with, for example, Al(Cu) wiring, also require thermal stabilities in excess of 450° C., good mechanical properties, resistance to crack generation and propagation, low defect densities, low water uptake, chemical resistance, processability by photolithographic techniques and gas phase etching procedures, and capacity for planarization.

Accordingly, considerable attention has focused on the replacement of silicon dioxide with new materials, particularly materials having lower dielectric constants, since both capacitive delays and power consumption depend on the dielectric constant of the insulator. This is not a simple matter given the complexities and demands of current semiconductor integration processes. Of the existing materials with demonstrated ultra-low dielectric constants, the highly fluorinated materials (e.g., Teflon) have the longest history. For example, attempts have been made to reduce the dielectric constant of polyimides by incorporating perfluoroalkyl-containing comonomers into the polymer structure (see, e.g., Haidar et al. (1991) *Mater. Res. Soc. Symp. Proc.* 227:35; Critchlen et al. (1972) *J. Polym. Sci.* A-1 10:1789; and Harris et al. (1991) *Mater. Res. Soc. Symp. Proc.* 227:3). The synthesis of polyimides based on 9,9-disubstituted xanthene dianhydrides, e.g., 6FXDA/6FDA (9,9-bis(trifluoromethoxy)xanthenetetracarboxylic dianhydride/2,2-bis(4-aminophenyl)-1,1,1,3,3,3-hexafluoropropane), as well as polyimides based on the TFMOB monomer (2,2'-bis(trifluoromethyl)benzidine), has been reported. See Muraka (March 1996) *Solid State Tech* 83 and Jang et al. (1994) *Mater. Res. Soc. Symp. Proc.* 337:25. Although these alkane polymers have the lowest dielectric constants of any homogeneous polymers, there are many liabilities. Current integration requirements call for exceptional thermal stability at temperatures in the range of 400–450° C. This temperature region is a problem for most organic polymers, and particularly for fluorocarbons. Also, adhesion of fluorinated materials (self-adhesion, adhesion to metals, dielectrics, ceramics, etc.) is a problem without some prior surface pretreatment. Further, the stability of fluorinated materials with metallurgy at elevated temperatures is problematic. The mechanical properties of known fluorinated materials are not ideal; they usually have large thermal expansion coefficients and are intrinsically soft materials. The latter creates a problem for chemical mechanical polishing (CMP) procedures. Finally, the methodology to develop other highly fluorinated materials such as fluorinated polyimides is limited by synthetic difficulties associated with the incorporation of a substantial number of pendant perfluoroalkyl groups.

Attempts have been made to reduce the dielectric constant of such materials through the introduction of kinks and conjugation-interrupting linkages in the polymer backbone to lower molecular polarizability and reduce chain-chain interactions (St. Clair et al. (1988) *Proc. Amer. Chem. Soc. Div. Polym. Mater. Sci. Eng.* 59:28). A more viable approach, however, has been controlled introduction of porosity into existing low dielectric constant materials.

Generation of porous polymer foams substantially reduces the dielectric constant of the material while maintaining the desired thermal and mechanical properties of the base (or "host") polymer. The reduction in dielectric constant is achieved by incorporating air voids, as air has a dielectric constant of 1. The advantage of a foam approach is illustrated in Hedrick et al. (1995) *Polymer* 36:2685, which illustrates in graph form a Maxwell-Garnett model of composite structures based on a matrix polymer having an initial dielectric constant of 2.8. Incorporation of a second phase of dielectric constant 1.0, as with the introduction of air-filled pores in a foam, causes a dramatic reduction in the dielectric constant. However, foams provide a unique set of problems for dielectric applications. The pore size must be much smaller than both the film thickness and any microelectronic device features. In addition, it is desired that the pores be closed cell, i.e. the connectivity between the pores must be minimal to prevent the diffusion of reactive contaminants. Finally, the volume fraction of the voids must be as high as possible to achieve the lowest possible dielectric constant. All of these features can alter the mechanical properties of the film and affect the structural stability of the foam.

An approach that has been developed for preparing a dielectric polymer foam with pore sizes in the nanometer regime involves the use of block copolymers composed of a high temperature, high $T_g$ polymer and a second component which can undergo clean thermal decomposition with the evolution of gaseous by-products to form a closed-cell, porous structure. See, e.g., Hedrick et al. (1993) *Polymer* 34:4717, and Hedrick et al. (1995) *Polymer* 36:4855. The process involves use of block copolymers that can undergo thermodynamically controlled phase separation to provide a matrix with a dispersed phase that is roughly spherical in morphology, monodisperse in size and discontinuous. By using as a host or matrix material a thermally stable polymer of low dielectric constant and, as the dispersed phase, a labile polymer that undergoes thermolysis at a temperature below the $T_g$ of the matrix to yield volatile reaction products, one can prepare foams with pores in the nanometer dimensional regime that have no percolation pathway; they are closed structures with nanometer size pores that contain air.

While the method has proved to be somewhat useful, the inventors herein have found formation of porous structures to be problematic in several respects. That is, although the concept was demonstrated in principle (see Hedrick et al. (1993); and Hedrick et al. (1995)), processing was complicated by synthetic difficulties and by the extremely small processing window. Also the thermal stability of the foam product was limited to about 350–375° C. (Hedrick et al. (1996) *J. Polym. Sci.; Polym. Chem.* 34, 2867). Furthermore, although dielectric constants of 2.3–2.4 were achieved at porosity levels less than about 20% (see Hedrick et al. (1996)), the pore content could not be further increased without comprising the small domain sizes and/or the non-interconnectivity of the pore structure.

The present invention is addressed to the aforementioned need in the art, and provides a novel method for preparing low dielectric materials comprised of foamed polymer structures with a significantly increased processing window, wherein the structures contain non-interconnected, "closed cell" pores in the form of sharply defined domains at most 200 Å in diameter, wherein the structures have very low dielectric constants (on the order of 3.0 or less), are thermally stable at temperatures in excess of 450° C., have good mechanical properties, are resistant to crack generation and propagation, and are readily processable by photolithographic techniques.

SUMMARY OF THE INVENTION

Accordingly, it is a primary object of the invention to address the above-mentioned need in the art by providing novel dielectric materials that are useful, inter alia, in electronic devices.

It is another object of the invention to provide such dielectric materials that are useful in integrated circuit devices.

It is still another object of the invention to provide such dielectric materials in the form of a foam.

It is yet another object of the invention to provide methods for manufacturing the present dielectric materials.

It is an additional object of the invention to provide an integrated circuit device in which metallic circuit lines on a substrate are electrically insulated from each other by a dielectric material of the invention.

Still a further object of the invention is to provide an integrated circuit packaging device (multichip module) that incorporates a dielectric material of the invention.

Additional objects, advantages and novel features of the invention will be set forth in part in the description which follows, and in part will become apparent to those skilled in the art upon examination of the following, or may be learned by practice of the invention.

The invention thus provides, in one embodiment, a novel dielectric material comprised of a porous material having closed cell pores less than about 200 Å in diameter, preferably less than about 100 Å in diameter, a void percentage in the range of approximately 5% to 35%, and a dielectric constant of less than 3.0, wherein the polymeric material comprises a host polymer that has a pre-process molecular weight in the range of approximately 750 to 100,000, and is thermally stable at temperatures of at least about 400° C., preferably temperatures of at least about 450° C. Such dielectric materials are prepared using the following process steps: (a) admixing, in a suitable solvent, (i) a thermally labile porogen having a reactive site that enables covalent attachment to another molecular moiety, (ii) a thermally stable, low dielectric constant host polymer having a high glass transition temperature $T_g$, and (iii) a coupling agent effective to covalently bind to both the reactive site of the porogen and the host polymer; (b) heating the admixture to a temperature $T_C$ effective to couple the porogen to the host polymer via the coupling agent, whereby a polymeric matrix is formed in which the porogen is present as a discrete phase within a continuous phase formed by the host polymer; and (c) heating the polymeric matrix to a temperature $T_D$ effective to degrade the porogen without affecting the host polymer, leaving closed cell "pores" behind, wherein $T_C < T_D < T_g$.

In another embodiment of the invention, an integrated circuit device is provided that comprises: (a) a substrate; (b) individual metallic circuit lines positioned on the substrate; and (c) a dielectric composition positioned over and/or between the individual metallic circuit lines, the dielectric composition comprising the novel dielectric material of the invention.

Still an additional embodiment of the invention relates to an integrated circuit packaging device providing signal and power current to an integrated circuit chip, the packaging device comprising:

(i) a substrate having electrical conductor means for connection to a circuit board, (ii) a plurality of alternating electrically insulating and conducting layers positioned on the substrate wherein at least one of the electrically insulating layers is comprised of a dielectric material as provided herein; and (iii) a plurality of vias for electrically interconnecting the electrical conductor, the conducting layers and the integrated circuit chip.

DETAILED DESCRIPTION OF THE INVENTION

Overview and Definitions

Figure 1:
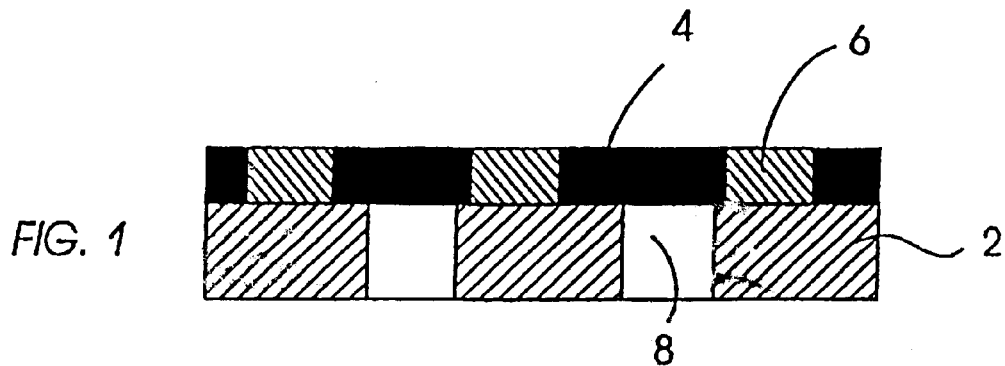
FIG. 1 is a cross-sectional view of a portion of an integrated circuit device fabricated using the novel dielectric materials provided herein.

Before describing the present invention in detail, it is to be understood that this invention is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "and," and "the" include plural referents unless the context clearly dictates otherwise. Thus, for example, reference to "a porogen" includes mixtures of porogens, a "host polymer" includes mixtures of host polymers, "a solvent" includes mixtures of solvents, and the like.

In describing and claiming the present invention, the following terminology will be used in accordance with the definitions set out below.

The term "alkyl" as used herein refers to a branched or unbranched saturated hydrocarbon group of 1 to approximately 24 carbon atoms, such as methyl, ethyl, n-propyl, isopropyl, n-butyl, isobutyl, t-butyl, octyl, decyl, tetradecyl, hexadecyl, eicosyl and tetracosyl, as well as cycloalkyl groups such as cyclopentyl and cyclohexyl. The term "lower alkyl" intends an alkyl group of 1 to 6 carbon atoms.

The term "alkylene" as used herein refers to a difunctional saturated branched or unbranched hydrocarbon chain containing from 1 to approximately 24 carbon atoms, typically 1 to approximately 12 carbon atoms, and includes, for example, methylene ($—CH_2—$), ethylene ($—CH_2—CH_2—$), propylene ($—CH_2—CH_2—CH_2—$), 2-methylpropylene ($—CH_2—CH(CH_3)—CH_2—$), hexylene ($—(CH_2)_6—$), and the like. "Lower alkylene" refers to an alkylene group of 1 to 6, more preferably 1 to 4, carbon atoms.

The term "alkoxy" as used herein refers to a substituent —O—R wherein R is alkyl as defined above. The term "lower alkoxy" refers to such a group wherein R is lower alkyl, e.g., methoxy, ethoxy and the like.

The term "aryl" as used herein, and unless otherwise specified, refers to an aromatic moiety containing 1 to 5 aromatic rings. For aryl groups containing more than one aromatic ring, the rings may be fused or linked. Aryl groups are optionally substituted with one or more inert, nonhydrogen substituents per ring; suitable "inert, nonhydrogen" substituents include, for example, halo, haloalkyl (preferably halo-substituted lower alkyl), alkyl (preferably lower alkyl), alkenyl (preferably lower alkenyl), alkynyl (preferably lower alkynyl), alkoxy (preferably lower alkoxy), alkoxycarbonyl (preferably lower alkoxycarbonyl), carboxy, nitro, cyano and sulfonyl. Unless otherwise indicated, the term "aryl" is also intended to include heteroaromatic moieties, i.e., aromatic heterocycles. Generally, although not necessarily, the heteroatoms will be nitrogen, oxygen or sulfur.

The term "halo" is used in its conventional sense to refer to a chloro, bromo, fluoro or iodo substituent. In the reagents and materials described and claimed herein, halo substituents are generally fluoro or chloro. The terms "haloalkyl," "haloaryl" (or "halogenated alkyl" or "halogenated aryl") refer to an alkyl or aryl group, respectively, in which at least one of the hydrogen atoms in the group has been replaced with a halogen atom.

The term "hydrocarbyl" is used in its conventional sense to refer to a hydrocarbon group containing carbon and hydrogen, and may be aliphatic, alicyclic or aromatic, or may contain a combination of aliphatic, alicyclic and/or aromatic moieties. The hydrocarbyl substituents herein generally contain 1 to 24 carbon atoms, more typically 1 to 12 carbon atoms, and may be substituted with various substituents and functional groups.

The term "polymer" is used to refer to a chemical compound that comprises linked monomers, and that may or may not be linear, crosslinked or thermosetting.

Process for Preparing the Novel Dielectric Material

In a first embodiment, the invention provides a process for preparing a low dielectric constant, foamed polymeric material having numerous advantages. In contrast to prior processes, the present method enables use of higher molecular weight polymers and simplified procedures, resulting in a thermally and chemically stable porous material with a high void percentage, on the order of 5% to 35%, and a dielectric constant less than 3.0, preferably less than 2.8, and most preferably less than 2.5.

The process involves, at the outset, admixing (i) a thermally labile porogen having a reactive site that enables covalent attachment to another molecular moiety, (ii) a thermally stable, low dielectric constant host polymer, and (iii) a coupling or "crosslinking" agent effective to covalently bind to both the reactive site of the porogen and the host polymer, in a suitable solvent. The admixture is heated to a crosslinking temperature $T_C$ to bring about coupling of the porogen to the host polymer via the coupling agent. This crosslinking reaction results in formation of a polymeric matrix in which the porogen is present as a discrete phase within a continuous phase formed by the host polymer. After formation of the matrix, the porogen is thermally degraded, leaving closed cell pores present throughout. This latter step involves heating the polymeric matrix to a temperature $T_D$ effective to degrade the porogen without affecting the host polymer, i.e., $T_D$ is less than the glass transition temperature $T_g$ of the host polymer.

1. The Host Polymer

As noted above, the present process allows use of high molecular weight host polymers, i.e., host polymers having a pre-processing molecular weight of at least about 750, and preferably at least about 5,000. Generally, the host polymer will have a pre-processing molecular weight in the range of approximately 750 to 100,000. In addition, the host polymer should have, after curing, a high glass transition temperature $T_g$, i.e., a $T_g$ of at least about 400° C., most preferably at least about 450° C.

The host polymer is typically although not necessarily a silicon-containing polymer, preferably organic polysilica. Organic polysilica is a polymeric compound comprising silicon, carbon, oxygen and hydrogen atoms. Suitable organic polysilica include (i) silsesquioxanes, (ii) alkoxy silanes, preferably partially condensed alkoxysilanes (e.g., partially condensed by controlled hydrolysis of tetraethoxysilane having an Mn of about 500 to 20,000), (iii) organically modified silicates having the composition $RSiO_3$ and $R_2SiO_2$ wherein R is an organic substituent, and (iv) orthosilicates, preferably partially condensed orthosilicates having the composition $SiOR_4$. Silsesquioxanes are polymeric silicate materials of the type $(RSiO_{1.5})_n$ where R is an organic substituent.

Suitable organic polysilica for use in the present invention are known to those skilled in the art. Preferably, the organic polysilica is a silsesquioxane. Suitable silsesquioxanes for the present invention include, but are not limited to, hydrogen silsesquioxanes, alkyl (preferably lower alkyl, e.g., methyl) silsesquioxanes, aryl (e.g., phenyl) or alkyl/aryl silsesquioxanes, and copolymers of silsesquioxanes (e.g., copolymers of polyimides and silsesquioxanes), all of which are commercially available (e.g., GR950 from Techniglass, Perrysburg, Ohio). Other suitable silsesquioxanes will be known to those skilled in the art and are disclosed in the pertinent texts, patent documents and literature references; see, e.g., U.S. Pat. No. 5,384,376, and *Chem. Rev.* 95:1409–1430 (1995).

Other suitable host polymers include without limitation high temperature polymers and thermosetting network resins such as polyimide, polybenzocyclobutene, and polyarylenes such as polyphenylenes, poly (phenylquinoxalines) and poly(arylene ethers). Polyimides, as known in the art, are formed by imidization of a poly (amic acid) or poly(amic acid ester), preferably a poly(amic acid ester), which is in turn synthesized from a diamine and a diester diacyl halide comprising the reaction product of a tetracarboxylic dianhydride and a lower alkanol. Suitable dianhydrides for preparing poly(amic acid esters) that can be imidized to give polyimides useful herein include, but are not limited to, the following: pyromellitic dianhydride (PMDA); benzophenone dianhydride (BPDA); 2,2-bis(3,4- dicarboxyphenyl) propane dianhydride; 3,3',4,4'-biphenyl-tetracarboxylic acid dianhydride, bis(3,4-dicarboxyphenyl) ether dianhydride; bis(3,4-dicarboxy-phenyl) thioether dianhydride; bisphenol-A bisether dianhydride; 2,2-bis(3,4-dicarboxylphenyl)-hexafluoropropane dianhydride; 2,3,6,7-naphthalenetetracarboxylic acid dianhydride; bis(3,4-dicarboxyphenyl) sulfone dianhydride; 1,2,5,6-naphthalene tetracarboxylic dianhydride; 2,2',3,3'-biphenyl tetracarboxylic dianhydride; 9,9-bis-(trifluoromethyl) xanthenetetracarboxylic dianhydride (6FXDA); 9-trifluoromethyl-9-phenyl xanthenetetracarboxylic dianhydride; 3,4,3',4'-benzophenone tetracarboxylic dianhydride; and terphenyl-dianhydride. Correspondingly, suitable diamines for preparing poly(amic acid ester) precursors that can be imidized for use herein include without limitation: p-phenylene diamine (PDA); 4,4'-diamino-diphenylamine; benzidine; 4,4'-diamino-diphenyl ether (ODA); 1,5-diamino-naphthalene; 3,3'-dimethyl-4,4'diamino-biphenyl; 3,3'-dimethoxybenzidine; 1,4-bis(p-aminophenoxy) benzene; 1,3-bis(p-aminophenoxy) benzene; 2,2-bis[4-aminophenyl] hexafluoropropane (6FDA); 1,1-bis (4-aminophenyl)-1-phenyl-2,2,2-trifluoroethane (3FDA); and 9,9-bis (4-aminophenyl) fluorene (FDA). Particularly preferred polyimides for use herein are formed by imidization of a poly(amic acid ester) formed from a dianhydride selected from the group consisting of PMDA, BPDA and 6FXDA and a diamine selected from the group consisting of PDA, ODA and 6FDAM. Examples of such preferred structures are as follows:

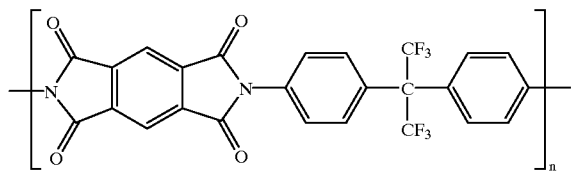

"PMDA/3FDA" Polyimide

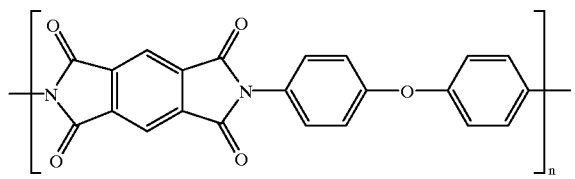

"PMDA/ODA" Polyimide

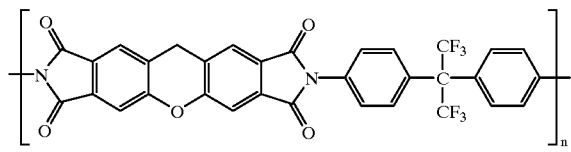

"6FXDA/6FDA" Polyimide

2. The Porogen

The porogen is a thermally degradable material which, upon heating to the material's decomposition temperature $T_D$, decomposes quantitatively into non-reactive species that can readily diffuse through the host polymer matrix. The temperature at which decomposition occurs should be sufficiently high to permit standard film preparation and solvent removal yet below the $T_g$ of the host polymer to avoid collapse of the foam matrix. Porogens thus have a decomposition temperature $T_D$ that is at least about 250° C., preferably 300° C.

Suitable porogens are generally decomposable polymers, including not only linear, branched and crosslinked polymers and copolymers, but also crosslinked polymeric nanoparticles with reactive surface functionality. Linear polymers are preferred, and vinyl-based polymers and polyethers are most preferred. Optimally, the porogen is a polymer comprised of monomer units selected from the group consisting of styrene, halogenated styrene, hydroxy-substituted styrene, lower alkyl-substituted styrene, acrylic acid, acrylamide, methacrylic acid, methyl acrylate, ethyl acrylate, butyl acrylate, ethylene oxide, propylene oxide, and combinations thereof, with poly(methyl methacrylate) (PMMA), polystyrene and poly(α-methyl styrene) preferred. Additional polymers that may serve as the porogen herein include, but are not limited to: aliphatic polycarbonates such as poly(propylene carbonate) and poly(ethylene carbonate); polyesters; polysulfones; polylactides; polylactones. The porogen may be a homopolymer, or it may be a copolymer comprised of any of the foregoing monomeric materials, e.g., poly(styrene-co-α-methyl styrene), poly (styrene-ethylene oxide), poly(ether-lactones), poly(ester-carbonates), and poly(lactone-lactides).

In order to couple the porogen to the host polymer, the porogen must have at least one reactive site capable of reacting with the coupling agent. The reaction may involve nucleophilic substitution, electrophilic substitution, free radical substitution, Diels Alder reactions, elimination, or any other mechanism capable of resulting in the formation of a new covalent bond. When the coupling reaction involves nucleophilic substitution, the porogen may be functionalized so as to contain a reactive site comprised of a nucleophilic moiety, e.g., —OH, —NH$_2$ or the like; alternatively, the porogen may be functionalized so as to contain a reactive site capable of reaction with such a nucleophilic moiety. Introduction of reactive sites can be carried out using conventional methods, known to those skilled in the art and/or described in the pertinent literature. For example, monohydroxyl-terminated porogen polymers may be prepared by anionic, ring opening, or group transfer polymerization methods; if desired, the hydroxyl terminus may then be converted to an amino end group, e.g., by reaction with 4-nitrophenyl chloroformate, followed by catalytic hydrogenation to the desired amine. See Hedrick et al. (1993) *Polymer* 34:4717; and Hedrick et al. (1995) *Polymer* 36:4855. Alternatively, a reactive site can be introduced in free radical processes through the use of a "masked" or protected initiator. For example, an amino-functionalized polystyrene can be prepared by using a living free radical polymerization process employing an appropriately functionalized AIBN initiator and 2,2,6,6-tetramethylpiperdinyloxy. Removal of the t-butoxycarbonyl protecting group leads to monoamino-terminated poly (styrene). The porogen polymer may also be end-functionalized with a Diels-Alder dienophile such as maleimide, acryloyl chloride, cinnamic acid or the like.

3. The Coupling Agent

The coupling agent which links the porogen to the host polymer in the first step of the present method is a compound having one or more functional group at each terminus, the first functional group capable of covalently binding to the reactive site of the porogen, and the second functional group capable of covalently binding to the host polymer. Thus, the molecular structure of the coupling agent may be represented as $R^1$—L—$R^2$ wherein $R^1$ is a functional group that enables covalent binding to the reactive site of the porogen, L is a hydrocarbylene linker containing at least two carbon atoms, and $R^2$ is a functional group that enables covalent binding to the host polymer.

As explained in the preceding section, the coupling agent may bind to the porogen via any chemical mechanism that results in covalent attachment. For coupling to porogens which contain nucleophilic sites, $R^1$ is a functional group, e.g., an isocyanate, a ketene, cyano, an imino ether, a carbodiimide, an aldehyde, a ketone, or the like, that enables covalent binding to a nucleophilic moiety. Conversely, $R^1$ may itself be a nucleophilic moiety and the reactive site of the porogen may be an isocyanate, a ketene, cyano, or the like.

$R^2$ is selected to enable covalent attachment to the host polymer. For polymers containing free OH or COOH moieties, then, $R^2$ will be a group that enables covalent binding to molecular moieties containing hydroxyl or carboxyl groups, e.g., terminal Si—OH moieties in silsesquioxanes and other siloxane polymers. Preferred $R^2$ moieties, when the host polymer is a silicon containing polymer such as a silsesquioxane, have the structural formula —$SiX_3$ wherein the X substituents may be the same or different, and either leaving groups or inert hydrocarbyl moieties, with the proviso that at least one of the X substituents must be a leaving group. Typically, the leaving groups are hydrolyzable so as to form a silanol linkage with a hydroxyl group present on the host polymer. Examples of suitable leaving groups include, but are not limited to, halogen atoms, particularly chloro, and alkoxy moieties, particularly lower alkoxy moieties. When all three X substituents are leaving groups, then, the moiety $R^2$ will then be, for example, trichlorosilyl, trimethoxysilyl, triethoxysilyl, or the like. If an inert hydrocarbyl substituent is present, it is generally a lower alkyl group, e.g., methyl, ethyl, isopropyl, n-propyl, t-butyl, etc. Thus, $R^2$ may also be diisopropylchlorosilyl, dimethylchlorosilyl, ethyldichlorosilyl, methylethylchlorosilyl, or the like. Other $R^2$ moieties will be appropriate for other host polymers, as will be appreciated by those skilled in the art. For example, when the host polymer is poly(benzocyclobutene), $R^2$ is benzocyclobutene. Also, like $R^1$, $R^2$ may also be a functional group that enables covalent binding to a nucleophilic moiety present on the host polymer; that is, $R^2$ may be, for example, an isocyanate, a ketene, cyano, an imino ether, a carbodiimide, an aldehyde, a ketone, or the like. Conversely, as with $R^1$, $R^2$ may be a nucleophilic moiety and the reactive site of the host polymer may be an isocyanate, a ketene, cyano, or the like.

The linker L between $R^1$ and $R^2$ is hydrocarbylene, typically $C_2$–$C_{24}$ hydrocarbylene, including, but not limited to, alkylene, arylene, and alkyl ether linkages, optionally substituted with one or more, typically one or two, lower alkyl, halogen, aryl, or other substituents. Particularly preferred L moieties are unsubstituted $C_2$–$C_{12}$ alkylene linkages, with $C_2$–$C_6$ alkylene linkages most preferred, and n-propylene and n-butylene being particularly optimal.

4. Crosslinking and Thermolysis

The crosslinking reaction is conducted in a suitable solvent as noted above, generally a high boiling point solvent such as N-methylpyrrolidone, dimethylacetamide, dimethylformamide, dimethylphenyl urea, cyclohexanone, γ-butyrolactone, or the like, with all reagents present in predetermined amounts. The coupling agent and porogen are optimally present in an approximately 1:1 molar ratio, and the solids content of the solution is typically about 10 wt. % to 60 wt. %, preferably about 30 wt. % to 40 wt. %. In order to effect crosslinking, the reaction mixture is heated to a temperature in the range of approximately 150° C. to 250° C., typically in the range of approximately 200° C. to 250° C., for up to 2 hours, preferably up to 1 hour, and most preferably up to about 30 minutes. The crosslinking temperature, or $T_C$, must be below the decomposition temperature $T_D$ of the porogen. Generally, although not necessarily, the reaction is conducted on a substrate, for example following deposition of the reaction mixture as a thin film on a substrate surface using spin-coating or the like.

At this point in the process, after crosslinking, a polymeric matrix has been synthesized in which the porogen is present as a discrete phase within a continuous phase comprised of the host polymer. The size of the porogen domains is generally less than about 20 nm in diameter, typically less than about 10 nm in diameter; the size of the domains is due to controlled phase separation and is governed by the selection of materials and processing conditions, as will be understood by those of ordinary skill in the art. The aforementioned polymeric matrix represents a novel composition of matter herein.

In the next step of the process, the polymeric matrix (whether or not present as a coating on a substrate surface) is heated to a temperature which is at minimum equal to $T_D$, the decomposition temperature of the porogen. The decomposition temperature, as alluded to earlier herein, will generally be at least about 300° C., but will be below the glass transition temperature $T_g$ of the host polymer. The porogen thus decomposes to volatile fragments which diffuse out of the rigid host matrix, leaving voids behind. The pore size in the "foamed" or porous material so prepared will generally correspond to the size of the domains of the decomposable polymer (thus, pore size can be altered by varying the molecular weight of the decomposable polymer).

The Novel Dielectric Material

The dielectric composition prepared using the methodology described in the preceding section is thus a porous polymeric material with a number of advantageous properties. The material has a dielectric constant of less than 3.0, preferably less than 2.8, most preferably less than 2.5, at 25° C. In addition, the composition has closed cell pores generally less than about 20 nm (i.e., less than about 200 Å), preferably less than about 10 nm (i.e., less than about 100 Å) in diameter, and a void percentage in the range of approximately 5% to 35%, resulting in enhanced mechanical toughness and crack resistance and improved isotropic optical properties. The novel dielectric composition also has a low thermal expansion coefficient at elevated temperatures (e.g., less than about 100 ppm, preferably less than about 40 ppm, more preferably less than about 30 ppm), which assists in avoiding film cracking during thermal processing. Further, the dielectric composition has mechanical properties that enable it to be chemically/mechanically planarized to facilitate lithographic formation of multiple circuit levels in multilevel integrated circuit devices. The dielectric composition is optically clear and adheres well to substrates.

Integrated Circuit Devices

A primary use of the novel dielectric compositions is in the manufacture of electronic devices, particularly integrated circuit devices. An integrated circuit device according to the present invention is exemplified in FIG. 1, wherein the device is shown as comprising substrate 2, metallic circuit lines 4, and a dielectric material 6 of the present invention.

The substrate 2 has vertical metallic studs 8 formed therein. The circuit lines function to distribute electrical signals in the device and to provide power input to and signal output from the device. Suitable integrated circuit devices generally comprise multiple layers of circuit lines that are interconnected by vertical metallic studs.

Suitable substrates 2 comprise silicon, silicon dioxide, silicon-germanium, glass, silicon nitride, ceramics, aluminum, copper, and gallium arsenide. Suitable circuit lines generally comprise a metallic, electrically conductive material such as copper, aluminum, tungsten, gold or silver, or alloys thereof. Optionally, the circuit lines may be coated with a metallic liner such as a layer of nickel, tantalum or chromium, or with other layers such as barrier or adhesion layers (e.g., SiN, TiN, or the like).

Figure 2:
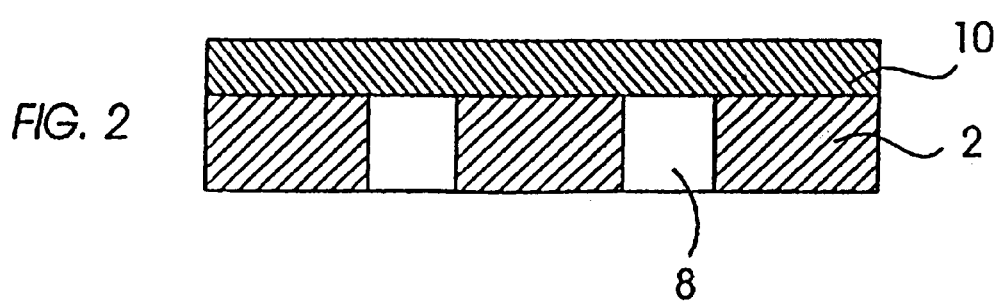
FIGS. 2–5 schematically illustrate a process for making an integrated circuit device using the present dielectric materials.

The invention also relates to processes for manufacturing integrated circuit devices containing a dielectric composition as described and claimed herein. Referring to FIG. 2, the first step of one process embodiment involves disposing on a substrate 2 a layer 10 of an admixture of (i) a porogen, (ii) a host polymer, (iii) a coupling agent, and (iv) a solvent (the solids content of the admixture is generally in the range of about 10 wt. % to 60 wt. %, preferably about 40 wt. % to 50 wt. %), all as described in detail earlier herein. The admixture is applied to the substrate by art known methods such as spin or spray coating or doctor blading. The film is heated to a temperature effective to crosslink the porogen and host polymer, followed by a further heating step to bring about thermal decomposition of the porogen and conversion of layer 10 to a dielectric composition of the invention.

Figure 3:
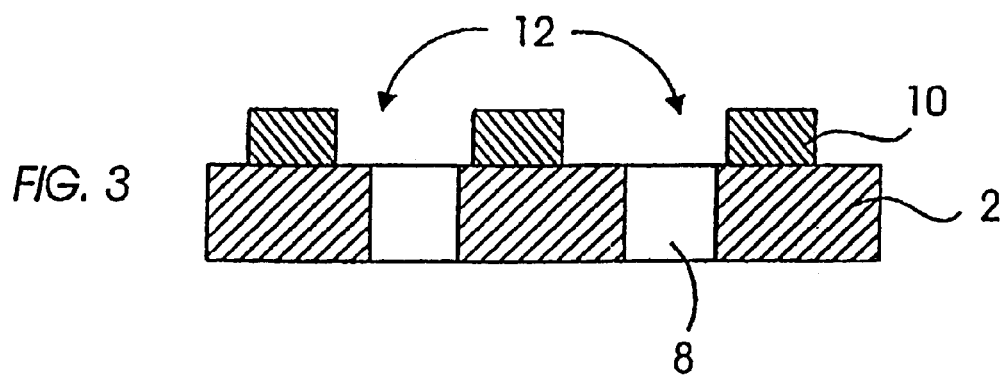

Referring to FIG. 3, the third step of the process involves lithographically patterning the layer 10 of dielectric composition to form trenches 12 (depressions) therein. The trenches 12 shown in FIG. 3 extend to the substrate 2 and to the metallic studs 8. Lithographic patterning generally involves: (i) coating the layer 10 of the dielectric composition with a positive or negative photoresist such as those marketed by Shipley or Hoechst Celanese, (AZ photoresist); (ii) imagewise exposing (through a mask) the photoresist to radiation such as electromagnetic, e.g., UV or deep UV; (iii) developing the image in the resist, e.g., with suitable basic developer; and (iv) transferring the image through the layer 10 of dielectric composition to the substrate 2 with a suitable transfer technique such as reactive ion blanket or beam etching (RIE). Suitable lithographic patterning techniques are well known to those skilled in the art such as disclosed in *Introduction to Microlithography*, 2nd Ed., eds. Thompson et al. (Washington, D.C.: American Chemical Society, 1994).

Figure 4:
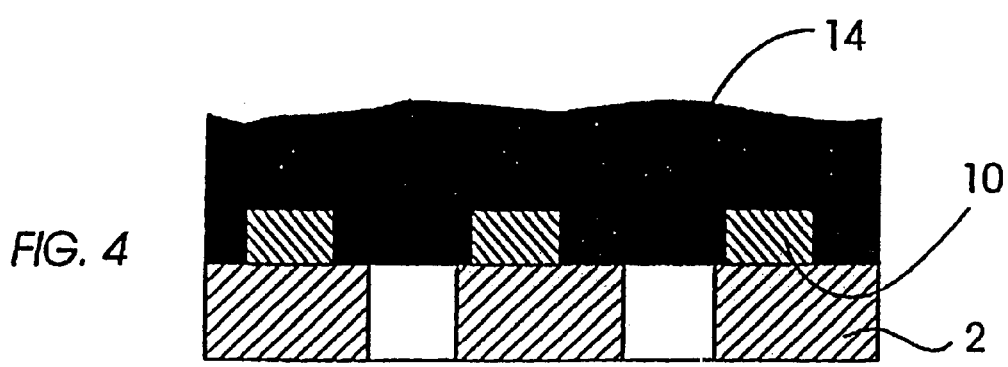

Referring to FIG. 4, in the fourth step of the process for forming an integrated circuit of the present invention, a metallic film 14 is deposited onto the patterned dielectric layer 10. Preferred metallic materials include copper, tungsten, and aluminum. The metal is suitably deposited onto the patterned dielectric layer by art-known techniques such as chemical vapor deposition (CVD), plasma-enhanced CVD, electro and electroless deposition (seed-catalyzed in situ reduction), sputtering, or the like.

Figure 5:
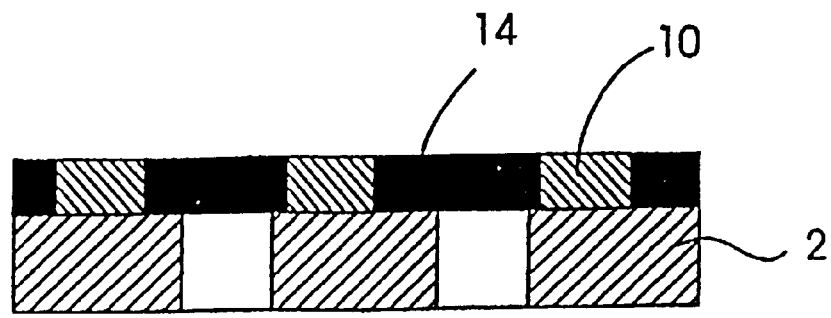

Referring to FIG. 5, the last step of the process involves removal of excess metallic material by "planarizing" the metallic film 14 so that the film is generally level with the patterned dielectric layer 10. Planarization can be accomplished using chemical/mechanical polishing or selective wet or dry etching. Suitable methods for chemical/mechanical polishing are known to those skilled in the art.

Figure 6:
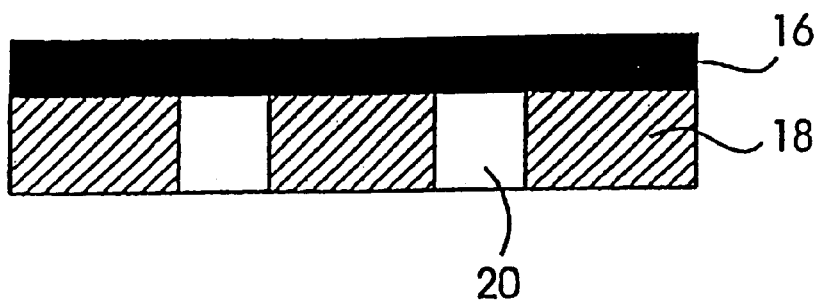
FIGS. 6–8 schematically illustrate an alternative process for making an integrated circuit device using the present dielectric materials.
Figure 7:
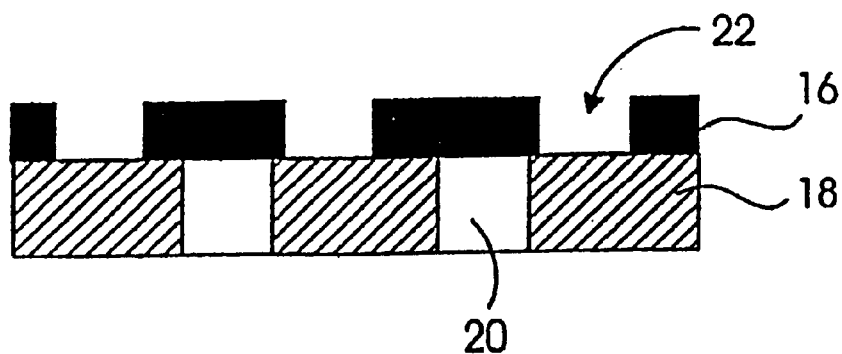
Figure 8:
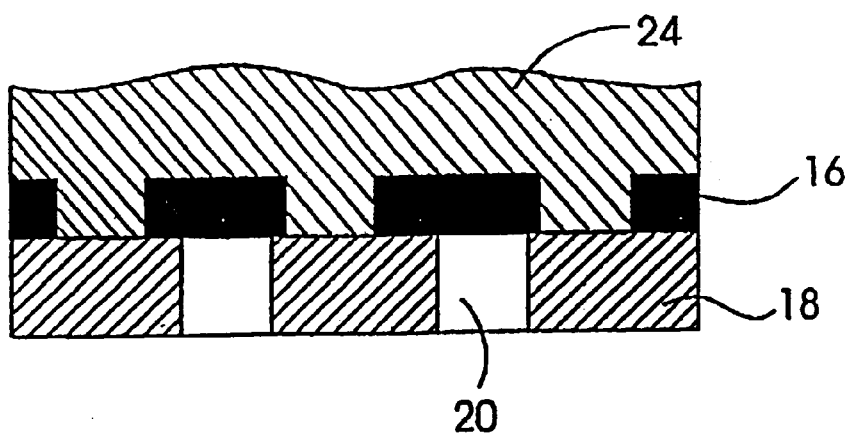

Referring to FIGS. 6–8, there is shown an alternative process for making an integrated circuit device of the invention. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the third step of the process, a layer 24 of a reaction mixture comprising the porogen, the host polymer, the coupling agent, and the selected solvent is deposited onto the patterned metallic film 16. In the last step of the process, the mixture is heated to crosslink the porogen and the host polymer, followed by heating to a higher temperature effective to decompose the porogen. Optionally, the dielectric layer so provided may then be planarized, if necessary, for subsequent processing in a multilayer integrated circuit.

The invention additionally relates to an integrated circuit packaging device (multichip module) for providing signal and power current to one or more integrated circuit chips comprising: (i) a substrate having electrical conductor means for connection to a circuit board; (ii) a plurality of alternating electrically insulating and conducting layers positioned on the substrate wherein at least of the layers comprises a film of a dielectric material of the present invention; and (iii) a plurality of vias for electrically interconnecting the electrical conductor means, conducting layers and integrated circuit chips.

The integrated circuit packaging device represents an intermediate level of packaging between the integrated circuit chip and the circuit board. The integrated circuit chips are mounted on the integrated circuit packaging device which is in turn mounted on the circuit board.

The substrate of the packaging device is generally an inert substrate such as glass, silicon or ceramic; suitable inert substrates also include epoxy composites, polyimides, phenolic polymers, high temperature polymers, and the like. The substrate can optionally have integrated circuits disposed therein. The substrate is provided with electrical conductor means such as input/output pins (I/O pins) for electrically connecting the packaging device to the circuit board. A plurality of electrically insulating and electrically conducting layers (layers having conductive circuits disposed in an dielectric insulating material) are alternatively stacked up on the substrate. The layers are generally formed on the substrate in a layer-by-layer process wherein each layer is formed in a separate process step.

The packaging device also comprises receiving means for receiving the integrated circuit chips. Suitable receiving means include pinboards for receipt of chip I/O pins or metal pads for solder connection to the chip. Generally, the packaging device also comprises a plurality of electrical vias generally vertically aligned to electrically interconnect the I/O pins, the conductive layers and integrated circuit chips disposed in the receiving means. The function, structure and method of manufacture of such integrated circuit packaging devices are well known to those skilled in the art, as disclosed, for example in U.S. Pat. Nos. 4,489,364, 4,508, 981, 4,628,411 and 4,811,082.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

EXPERIMENTAL

The following examples are put forth so as to provide those of ordinary skill in the art with a complete disclosure and description of how to prepare and use the oligomers and polymers disclosed and claimed herein. Efforts have been made to ensure accuracy with respect to numbers (e.g., quantities, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

Example 1

Amino-terminated poly(methyl methacrylate) (Mn of 7–500), methyl silsesquioxane, and 1-isocyanato-3-trimethoxysilyl-propane (molar ratio 1:7.5:1) are dissolved in dimethylphenylurea to provide a coating solution (45 wt. % solids content). The coating is cast by spin coating onto silicon wafers to form films from 1 to 10 microns thick. Crosslinking is effected by heating the film for 1.5 hr at 200° C. The temperature is then increased to 350° C. to bring about decomposition of the porogen. The porous material that results has a dielectric constant of less than about 3.0 (at 25° C.).

Example 2

The process of Example 1 is repeated substituting amino-substituted polystyrene for amino-substituted poly(methyl methacrylate) as the porogen. Substantially the same results are expected.

Example 3

The process of Example 1 is repeated substituting amino-substituted poly(propylene oxide) for amino-substituted poly(methyl methacrylate) as the porogen. Substantially the same results are expected.

Example 4

The process of Example 1 is repeated substituting poly(arylene) for the silsesquioxane "host polymer," and 4-(phenylethynyl)benzoyl chloride for 1-isocyanato-3-trimethoxysilyl-propane as the coupling agent. Substantially the same results are expected.

Example 5

The process of Example 1 is repeated substituting polybenzocyclobutene for the silsesquioxane "host polymer." Substantially the same results are expected.

Example 6

The process of Example 1 is repeated substituting 3-isocyanatopropylbenzoyclobutane for 1-isocyanato-3-trimethoxysilyl-propane as coupling agent. Substantially the same results are expected.

Example 7

The process of Example 1 is repeated substituting 1-cyano-3-trichlorosilyl-propane for 1-isocyanato-3-trimethoxysilyl-propane as coupling agent. Substantially the same results are expected.

What is claimed is:

1. A method for forming an integrated circuit, comprising:
   (a) depositing a metallic film on a substrate;
   (b) lithographically patterning the metallic film to provide a pattern of individual metallic circuit lines on the substrate;
   (c) preparing a solution of (i) a thermally labile porogen having a reactive site that enables covalent attachment to another molecular moiety, (ii) a thermally stable, low dielectric constant host polymer having a glass transition temperature $T_g$, and (iii) a coupling agent effective to covalently bind to both the reactive site of the porogen and the host polymer, and depositing the solution around the metallic lines on the substrate;
   (d) heating the solution to a temperature $T_C$ effective to couple the porogen to the host polymer via the coupling agent, whereby a polymeric matrix is formed in which the porogen is present as a discrete phase within a continuous phase formed by the host polymer; and
   (e) heating the polymeric matrix to a temperature $T_D$ effective to degrade the porogen without affecting the host polymer, thereby producing a dielectric material in the form of a porous structure, wherein $T_D$ is greater than $T_C$ but less than $T_g$.

2. The method of claim 1, wherein the host polymer is silicon-containing.

3. The method of claim 2, wherein the host polymer is selected from the group consisting of silsesquioxanes, alkoxysilanes, organic silicates, orthosilicates, and combinations thereof.

4. The method of claim 3, wherein the host polymer is a silsesquioxane.

5. The method of claim 4, wherein the silsesquioxane is selected from the group consisting of hydrogen silsesquioxanes, alkyl silsesquioxanes, aryl silsesquioxanes, and derivatives and combinations thereof.

6. The method of claim 5, wherein the host polymer is selected from the group consisting of hydrogen silsesquioxanes, lower alkyl silsesquioxanes and phenyl silsesquioxanes.

7. The method of claim 3, wherein the host polymer is a copolymer of a polyimide and a silsesquioxane.

8. The method of claim 1, wherein the host polymer is a polyimide.

9. The method of claim 1, wherein the host polymer is a polybenzocyclobutene.

10. The method of claim 1, wherein the host polymer is a poly(arylene).

11. The method of claim 1, wherein the host polymer is a poly(arylene ether).

12. The method of claim 1, wherein the pre-process molecular weight of the host polymer is in the range of approximately 750 to 100,000.

13. The method of claim 1, wherein the porogen is a crosslinked nanoparticle with reactive surface functionality.

14. The method of claim 1, wherein the porogen comprises a vinyl-based polymer.

15. The method of claim 1, wherein the porogen is a polymer comprised of aliphatic polycarbonates, polyesters, polysulfones, polylactides, polylactones, and combinations thereof.

16. The method of claim 1, wherein the porogen is a polymer comprised of monomer units selected from the group consisting of styrene, halogenated styrene, hydroxy-substituted styrene, lower alkyl-substituted styrene, acrylic acid, acrylamide, methacrylic acid, methyl acrylate, ethyl acrylate, butyl acrylate, ethylene oxide, propylene oxide, and combinations thereof.

17. The method of claim 16, wherein the porogen is poly(methyl methacrylate).

18. The method of claim 16, wherein the porogen is polystyrene.

19. The method of claim 16, wherein the porogen is poly(propylene oxide).

20. The method of claim 1, wherein the polymeric matrix is comprised of porogen domains averaging less than about 20 nm in diameter.

21. The method of claim 1, wherein the porogen represents in the range of about 5% to 35% of the polymeric matrix.

22. The method of claim 1, wherein the coupling agent has the formula $R^1$—L—$R^2$ wherein $R^1$ is a functional group that enables covalent binding to the reactive site of the porogen, L is a hydrocarbylene linker containing at least two carbon atoms, and $R^2$ is a functional group that enables covalent binding to the host polymer.

23. The method of claim 22, wherein L is selected from the group consisting of alkylene, arylene and alkyl ether linkages, optionally substituted with one or more lower alkyl, halogen or aryl substituents.

24. The method of claim 23, wherein L is alkylene.

25. The method of claim 24, wherein L is $C_2$–$C_{12}$ alkylene.

26. The method of claim 25, wherein L is $C_2$–$C_6$ alkylene.

27. The method of claim 26, wherein L is n-propylene or n-butylene.

28. The method of claim 23, wherein L is arylene.

29. The method of claim 23, wherein L is an alkyl ether linkage.

30. The method of claim 22, wherein the reactive site of the porogen and the $R^1$ functional group are mutually reactive groups.

31. The method of claim 30, wherein the reactive site of the porogen is a hydroxyl or amino group, and $R^1$ is selected from the group consisting of an isocyanate, a ketene, cyano, an imino ether, a carbodiimide, an aldehyde and a ketone.

32. The method of claim 22, wherein the host polymer is a silsesquioxane and $R^2$ is —$SiX_3$ wherein at least one X is a leaving group.

33. The method of claim 32, wherein all three X moieties are leaving groups.

34. The method of claim 33, wherein each X is lower alkoxy or halo.

* * * * *